(12) United States Patent
Mandelman et al.

(10) Patent No.: US 6,674,139 B2
(45) Date of Patent: Jan. 6, 2004

(54) INVERSE T-GATE STRUCTURE USING DAMASCENE PROCESSING

(75) Inventors: Jack A. Mandelman, Stormville, NY (US); Carl J. Radens, LaGrangeville, NY (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 107 days.

(21) Appl. No.: 09/910,636

(22) Filed: Jul. 20, 2001

(65) Prior Publication Data

US 2003/0020125 A1 Jan. 30, 2003

(51) Int. Cl.$^7$ .................. H01L 29/76; H01L 29/94; H01L 31/113; H01L 31/119; H01L 31/062
(52) U.S. Cl. ........................ 257/412; 257/408
(58) Field of Search ................. 257/382–412, 257/336–344; 438/307–305

(56) References Cited

U.S. PATENT DOCUMENTS

| | | | |
|---|---|---|---|
| 5,053,849 A | 10/1991 | Izawa et al. | |
| 5,091,763 A | * 2/1992 | Sanchez | 257/344 |
| 5,162,884 A | 11/1992 | Liou et al. | |
| 5,175,119 A | 12/1992 | Matsutani | |
| 5,182,619 A | 1/1993 | Pfiester | |
| 5,202,277 A | * 4/1993 | Kameyama et al. | 438/302 |
| 5,241,203 A | 8/1993 | Hsu et al. | |
| 5,290,720 A | 3/1994 | Chen | |
| 5,583,067 A | 12/1996 | Sanchez | |
| 5,585,295 A | 12/1996 | Wu | |
| 5,654,218 A | 8/1997 | Lee | |
| 5,719,424 A | * 2/1998 | Ahmad et al. | 257/336 |
| 5,766,969 A | * 6/1998 | Fulford et al. | 438/305 |
| 5,783,479 A | * 7/1998 | Lin et al. | 438/592 |
| 5,854,101 A | 12/1998 | Wu | |
| 5,930,610 A | 7/1999 | Lee | |
| 5,985,726 A | 11/1999 | Yu et al. | |
| 5,986,305 A | * 11/1999 | Wu | 257/344 |
| 6,002,150 A | 12/1999 | Gardner et al. | |
| 6,077,733 A | 6/2000 | Chen et al. | |
| 6,107,149 A | * 8/2000 | Wu et al. | 257/336 |

* cited by examiner

Primary Examiner—Cuong Quang Nguyen
(74) Attorney, Agent, or Firm—McGinn & Gibb, PLLC; Richard A. Henkler, Esq.

(57) ABSTRACT

A field effect transistor has an inverse-T gate conductor having a thicker center portion and thinner wings. The wings may be of a different material different than the center portion. In addition, gate dielectric may be thicker along edges than in the center. Doping can also be different under the wings than along the center portion or beyond the gate. Regions under the wings may be doped differently than the gate conductor. With a substantially vertical implant, a region of the channel overlapped by an edge of the gate is implanted without implanting a center portion of the channel, and this region is blocked from receiving at least a portion of the received by thick portions of the gate electrode.

13 Claims, 10 Drawing Sheets

INVERSE T-GATE STRUCTURE USING DAMASCENE PROCESSING

BACKGROUND OF THE INVENTION

1. Field of the Invention

The present invention generally relates to semiconductor transistors, and more particularly, to an improved structure of (and method for forming) an inverse-T gated metal oxide semiconductor field effect transistor.

2. Description of the Related Art

Fabrication processes for metal oxide semiconductor field-effect transistors ("MOSFET") devices are well known. Gate structures for MOSFETs are generally manufactured by placing an undoped polycrystalline silicon ("polysilicon") layer over a relatively thin insulator ("gate oxide") layer. The gate oxide sits on a substrate having a well region. The polysilicon layer and the oxide layer are then patterned to form a gate conductor over the well region and the structure is subjected to implanted impurities to make selective regions conductive. Such implantation serves both to dope the gate conductor and to form lightly-doped regions ("LDD") in the silicon substrate.

If the dopant species used is n-type, then the resulting MOSFET is typically an NMOS ("n-channel") transistor device. Conversely, if the dopant species is p-type, then the resulting MOSFET is typically a PMOS ("p-channel") transistor device. Integrated circuits typically use either n-channel devices exclusively, p-channel devices exclusively, or a combination of both on a single substrate. The combination of a n-channel device and a p-channel device on a single substrate is termed a complementary MOS ("CMOS") device. In such structures, one of the active regions, typically the region in which the p-channel device is to be formed, is covered with a masking layer. N-type dopants are implanted into the n-channel devices.

After the first doping process, insulating sidewall spacers are formed on the sidewalls of the gate structure. A second implant dose is then forwarded into the gate structure and the silicon substrate. The second implant is done at a higher implant energy and dose than the first and creates source/drain regions within the silicon substrate. The gate conductor is preferably used to self-align the impurities implanted into the substrate to form the source and drain regions. The process is then repeated for the p-channel transistor, except now p-type dopants are implanted and the n-channel transistors are protected with a mask.

It has been found advantageous to utilize a gate conductor that has the shape of an inverted "T" when viewed in a cross-section. Specifically, an inverse-T gate has a thick center section bordered by wings that are thinner. Such a structure allows a small portion of impurities to pass through the thinner outer portions (wings) of the inverted-T structure into the substrate while simultaneously blocking such impurities from the thicker main part of the gate conductor. Therefore, with an inverse-T gate structure, the LDD regions can be simultaneously formed with the heavily doped source/drain regions in a single doping process (as opposed to the two-stage doping process discussed above).

Various methods of fabricating MOSFETs with inverse-T gate structures have been tried previously. For example, inverse-T shaped gates in MOSFETs are disclosed in U.S. Pat. No. 5,654,218 and U.S. Pat. No. 5,241,203, which are hereby incorporated by reference. U.S. Pat. No. 5,654,218 discloses a process using an isotropic etch to undercut a first sacrificial layer to form the wing-type structures forming the gate conductor. Control of this undercutting and resulting dimensions are inadequate in view of the smaller dimension of such devices being used today. The U.S. Pat. No. 5,241,203 teaches of a timed etch to control thickness of the wing-structures forming the gate structure. Again, control of etching of these wing-structures is inadequate with today's ultra-small devices. Thickness variations of the wing structures result in varying concentration and depth of the lightly-doped-drain (LDD) and halo implants.

In other words, inverse-T gate structures are conventionally manufactured by etching the gate itself or etching masks that form the gate. Such processes are inherently difficult to control because they are heavily dependent upon slight variations in the etching/undercutting processes. Therefore, any slight variation in pressure, temperature, time, chemical concentration, etc. will cause an inconsistent material removal which will vary the thickness of the wings of the inverse-T gate structure. The amount of doping which passes through the wings of the inverse-T gate structure and reaches the underlying substrate is highly dependent upon the thickness of the wings. When the manufacturing process does not consistently produced wings having a uniform thickness, the doping of the substrate regions below the wings becomes inconsistent. This leads to non-uniform device performance and increases the defect rate.

As inverse-T gate conductors become smaller and smaller with advancing technology, these variations in the etching/undercutting processes produce inconsistencies beyond acceptable manufacturing tolerances. Therefore, there is a need for a new system/method of manufacturing inverse-T gate structures that does not rely upon an etching/undercutting process. Further, there is a need for a process which consistently manufactures inverse-T gate structures with the same size dimensions to ensure uniform doping of the LDD regions. The invention described below provides such a method/system.

SUMMARY OF THE INVENTION

In view of the foregoing and other problems of the conventional methods of making inverse-T gate structures, the present invention has been devised, and it is an object of the present invention to provide a structure and method for making inverse-T gate structures in MOSFETs that uses a damascene process and avoids controlled etches for wing thicknesses.

The invention describes a field effect transistor having a substrate with a well region, a source region and a drain region. Also included in the invention is a gate oxide above the well region and a gate conductor above the gate oxide. The gate conductor has an inner inverse-T structure and an outer conductive material different than the inner inverse-T structure. Further, the outer conductive material covers the top and sides of the inverse-T structure. The outer conductive material is preferably tungsten. Also, the outer conductive material and the inverse-T structure are the same length along the gate oxide. The outer conductive material has an inverse-U shape that matches an outline of the inverse-T shape of the inner inverse-T structure. The inverse-T structure contains a center portion with a thickness greater than outer wing portions. The wing portions are a different conductive material than the center portion.

The invention further includes a gate oxide which has a center section that is thinner than the outer regions of the gate conductor. The center section of the gate oxide includes a higher nitrogen content than the outer regions of the gate oxide. The gate conductor has an inverse-T structure. The outer regions of the gate oxide are positioned under the wing portions.

Another object of the present invention is to form a field effect transistor using a method that deposits the conductor layer on the underlying layer, patterns a mask over the conductor layer, forms sidewall spacers within an opening in the mask and deposits another conductor between the sidewall spacers within the opening. The first and second conductors are inverse-T gate conductors, The method removes the mask, removes portions of the first conductor layer outside the sidewall spacers, and removes the sidewall spacers.

The invention also forms an oxide layer on a substrate to form the underlying layer. Further, the invention implants an impurity into the substrate to form source and drain regions in the substrate adjacent the inverse-T gate conductor. The invention implants a single impurity and simultaneously forms lightly-doped-drain and source regions in the substrate under the wing portions and more heavily doped drain and source regions in the substrate adjacent the wing portions. Further, implanting the impurity into the substrate can be used to form a halo implant in the substrate under the inverse-T gate conductor. In addition, the inverse-T gate conductor has a center portion with a thickness greater than outer wing portions. The implanting process forms the halo implant in the substrate under the wing portions. The invention implants the impurity into the well region of the substrate through the opening in the mask. In the invention, the thickness of the conductor layer determines the thickness of the wing portions.

Further, the invention forms a sacrificial layer within the opening, sacrificial spacers along walls of the opening, removes the first sacrificial layer, deposits a conductor within the opening, removes the mask and removes the sacrificial spacers.

In addition, the present invention forms an oxide layer in the presence of nitrogen such that the oxide layer has outer portions under the sacrificial spacers that are thicker than a center section of the oxide layer, deposits a conductor within the opening, removes the mask and removes the sacrificial spacers.

The invention provides a new system/method of manufacturing inverse-T gate structures that does not rely upon an etching/undercutting process. Further, the invention consistently manufactures inverse-T gate structures with the same size dimensions to ensure uniform doping of the LDD and halo regions.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

As mentioned above, the amount of doping which passes through the wings of the inverse-T gate structure and reaches the underlying substrate is highly dependent upon the thickness of the wings. When the manufacturing process does not consistently produced wings having a uniform thickness, the doping of the substrate regions below the wings becomes inconsistent. This leads to non-uniform device performance and increases the defect rate.

As inverse-T gate conductors become smaller and smaller with advancing technology, variations in the conventional etching/undercutting wing sizing processes produce inconsistencies beyond acceptable manufacturing tolerances. The invention described below provides a new system/method of manufacturing inverse-T gate structures that does not rely upon the conventional etching/undercutting process to determine wing thickness. Further, the invention consistently manufactures inverse-T gate structures with the same size dimensions to ensure uniform doping of the LDD and halo regions.

More specifically, the invention utilizes damascene processing to form the inverse-T gate structures. Such processing avoids problems encountered by conventional methods in large part because the etching of the gate/mask is avoided. Two examples of the invention are show below. The first example is shown in FIGS. 1–11 and the second example is shown in FIGS. 12–20. However, as would be known by one ordinarily skilled in the art, the invention is not limited to these examples. Instead, the invention is applicable to all variations of such processing which avoids the disadvantageous affects of the conventional etching/undercutting, discussed above.

Figure 1:
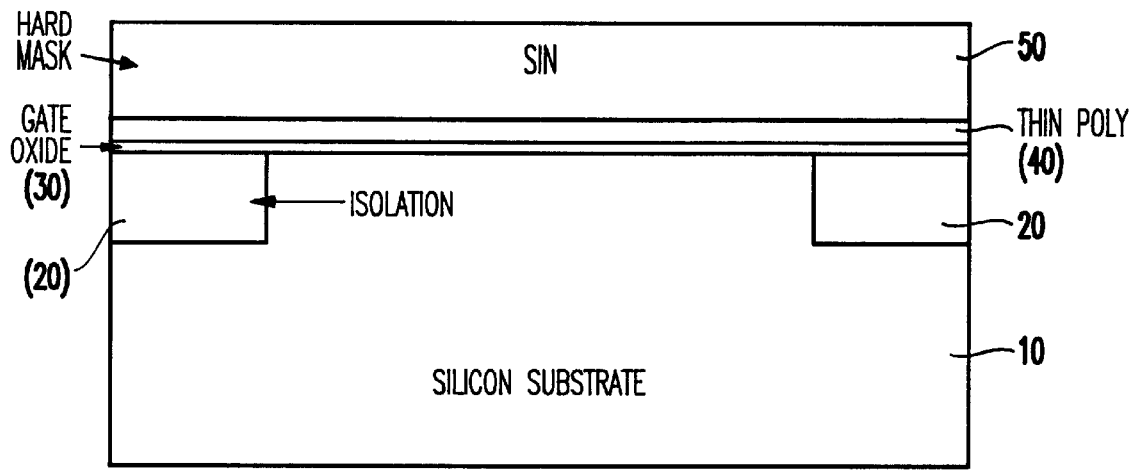
FIG. 1 is a schematic diagram of a cross-sectional view of a stage in the fabrication of a MOSFET with an inverse-T gate structure using the invention.

Referring now to FIGS. 1–11, the first embodiment of the invention is shown. In FIG. 1, the invention begins with a substrate 10 (silicon). Using conventional lithographic patterning techniques, the invention patterns openings in the substrate 10 and fills the openings with an insulator material to form isolation regions 20. The isolation regions 20 are principally utilized to electrically insulate adjacent devices.

There are many methods available to pattern such openings in materials in semiconductor technologies. For example, one known lithographic process involves exposing a photosensitive mask with a pattern, followed by development of the mask, and rinsing of the non-developed material to produce a patterned mask. An etching process can be performed through the mask to etch the underlying material, after which the mask is removed. The openings thus formed can then be filled with a conformal material. Such filling of the openings is commonly referred to as damascene processing. The structure is then generally planarized using any conventional planarization technique such as chemical mechanical polishing (CMP) to remove the excess material such that the deposited material remains only in the openings and the structure has a smooth upper surface.

The details of such processes are well known by those ordinarily skilled in the semiconductor technology art field and are not discussed in detail herein so as not to unnecessarily obscure the salient features of the invention. The patterning, deposition, etching, implanting, etc. processes described below are similarly well known and are not discussed in detail. Further, the invention is not limited to these specific processes. Instead, the invention can utilize any similar processing (including processes developed in the future) to perform the steps detailed below and achieve the results (e.g., the structure) produced by the invention.

After the isolation regions 20 are formed in the substrate 10, a gate oxide 30 is grown over the structure. Then, a thin polysilicon layer 40 is deposited. The polysilicon layer 40 will become the wings of the inverse T gate structure. Therefore, the thickness of the wings of the inventive inverse-T gate structure is controlled by the thickness of the polysilicon layer 40 deposited in this process. If it is very easy to control the thickness of the thin polysilicon layer 40 because the deposition process can be tightly controlled through flow rate and timing controls. There is substantially more control in the polysilicon layer 40 deposition process that there is in a conventional material removal (etching/undercutting) process. As discussed above, one of the major drawbacks of conventional systems is that they utilize etching/undercutting processes to determined the thickness of the wings of the inverse-T gate structure. Therefore, the invention produces wings of the inverse-T gate structure that have much more consistent thicknesses than those produced conventionally because the invention controls the thickness through a deposition process.

Figure 2:
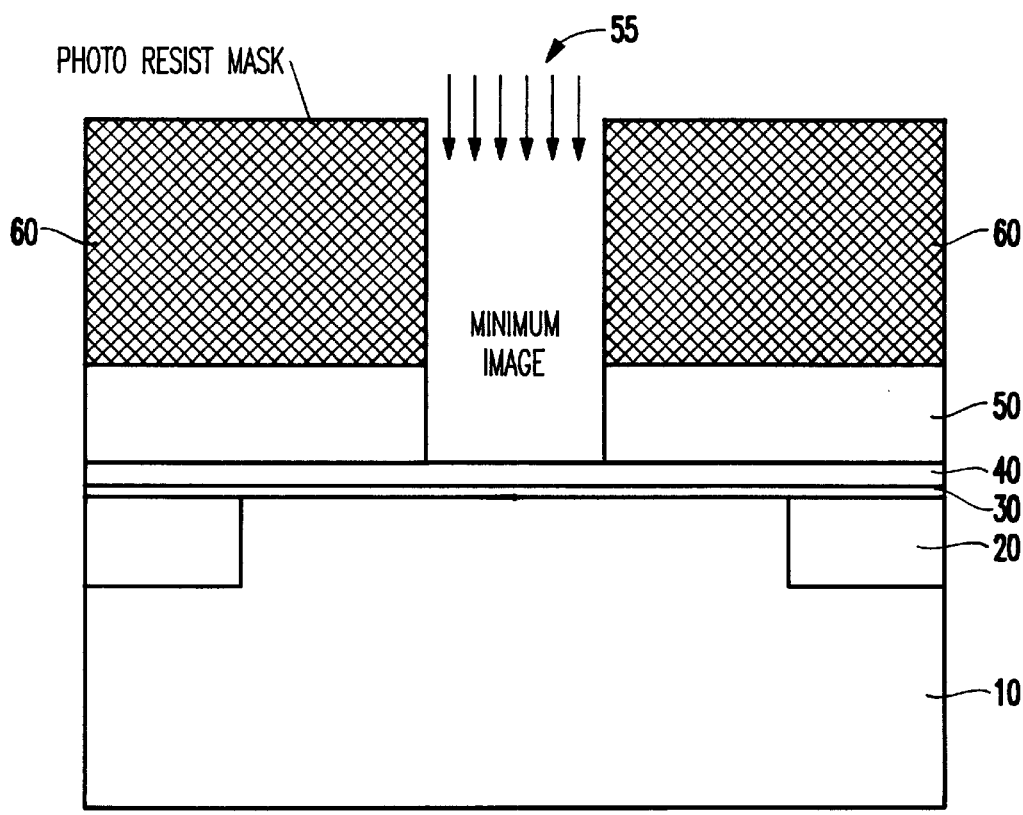
FIG. 2 is a schematic diagram of a cross-sectional view of a stage in the fabrication of a MOSFET with an inverse-T gate structure using the invention.

Next, a hard mask layer 50 is deposited over the polysilicon layer 40. Preferably, the hard mask 50 comprises silicon nitride. As shown in FIG. 2, a photoresist mask 60 is patterned over the hard mask 50 and, using the patterned photoresist mask 60, and opening is etched in the hard mask 50. An impurity 55 (e.g., N or P-type well implant) is implanted into the substrate (through the polysilicon 40 and gate oxide 30 ) to form the well region (not specifically illustrated) in the substrate 10.

Figure 3:
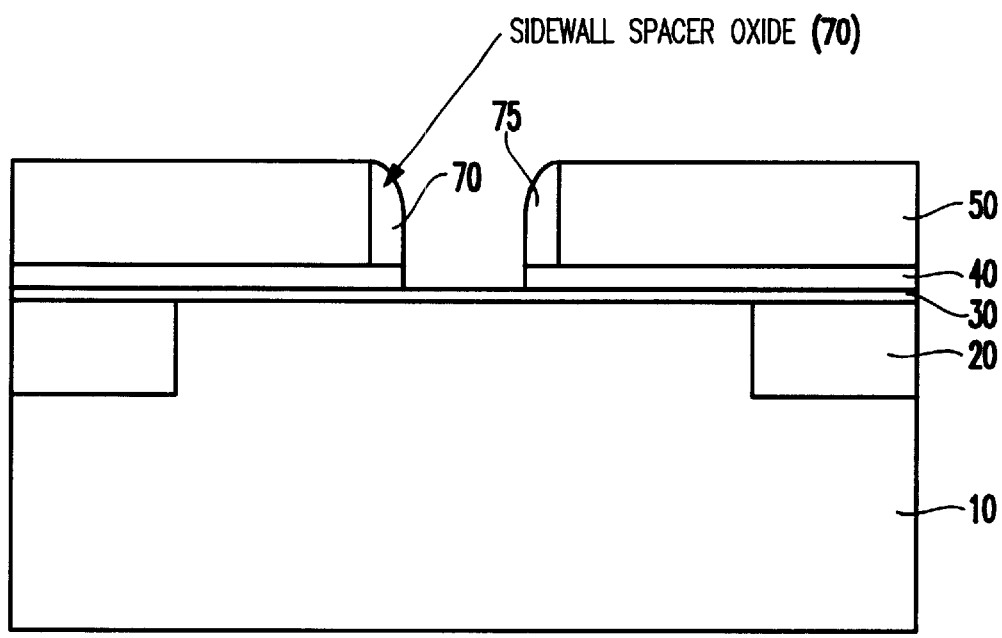
FIG. 3 is a schematic diagram of a cross-sectional view of a stage in the fabrication of a MOSFET with an inverse-T gate structure using the invention.

In FIG. 3, the sidewall spacers 70, 75 are formed. The formation of such insulating spacers is a well-known conventional process. For example, an insulator (such as an oxide) is formed over the surface of the structure. Subsequently, a directional isotropic etch is performed to remove the insulator material from the horizontal surfaces while allowing the insulator material to remain on vertical surfaces.

Figure 4:
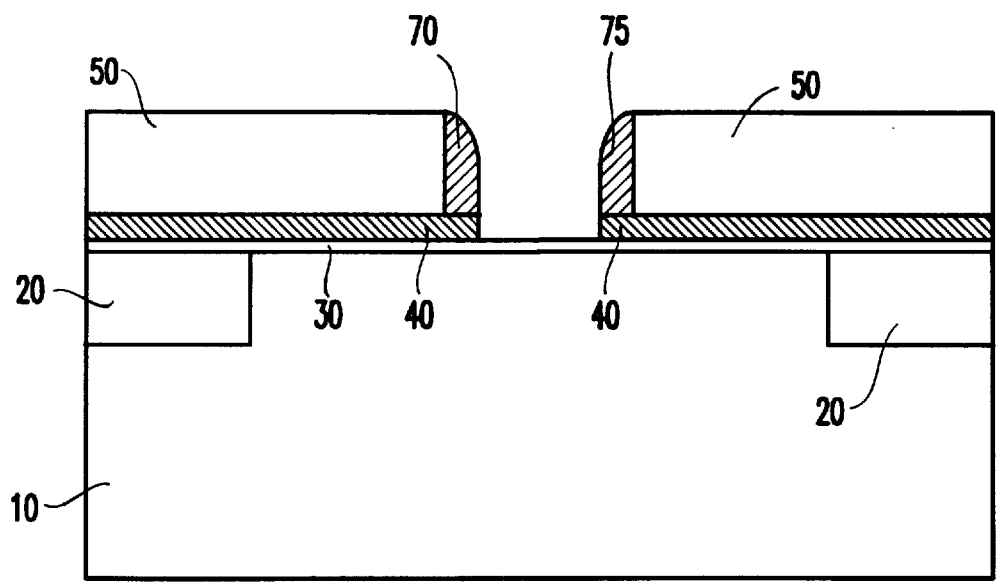
FIG. 4 is a schematic diagram of a cross-sectional view of a stage in the fabrication of a MOSFET with an inverse-T gate structure using the invention.
Figure 5:
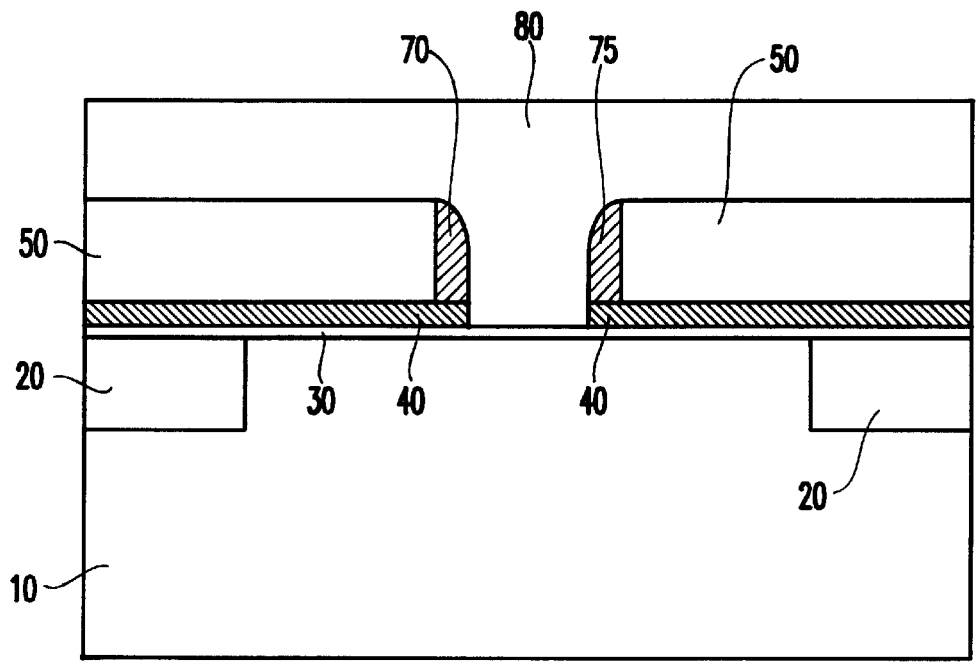
FIG. 5 is a schematic diagram of a cross-sectional view of a stage in the fabrication of a MOSFET with an inverse-T gate structure using the invention.
Figure 6:
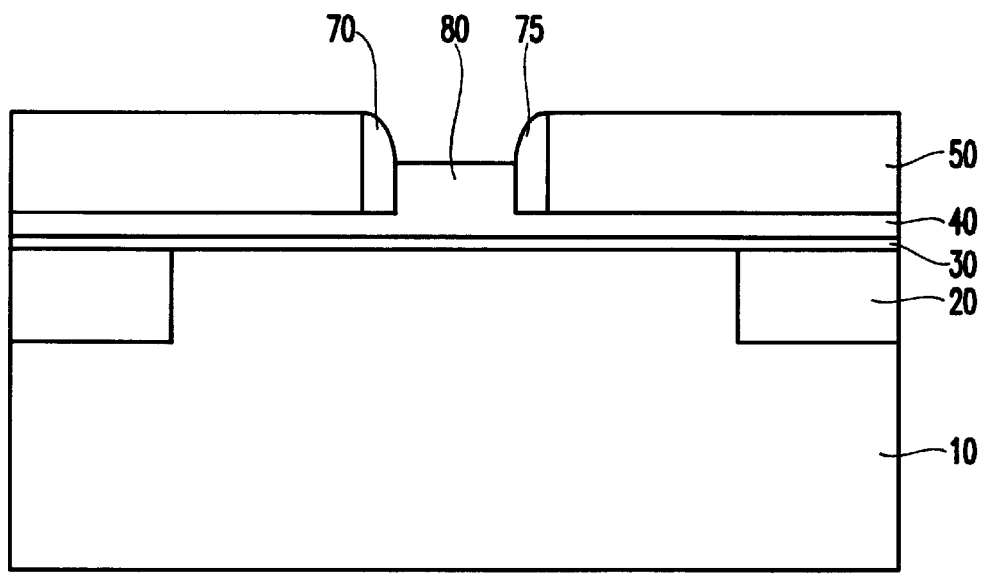
FIG. 6 is a schematic diagram of a cross-sectional view of a stage in the fabrication of a MOSFET with an inverse-T gate structure using the invention.

Referring to FIG. 4, a selective etch is utilized to remove the exposed portion of the polysilicon layer 40. Then, additional polysilicon 80 is deposited over the entire structure, as shown in FIG. 5. In FIG. 6, the polysilicon 80 is removed using a well-known chemical composition that removes polysilicon but does not substantially affect the silicon nitride 50 or the oxide 70, 75. This removal process is continued until the polysilicon is recessed below the top surface of the silicon nitride 50, as shown in FIG. 6. Note that, in FIG. 6, the polysilicon materials 40, 80 are shown as a uniform structure. These materials 40, 80 can be the same or different materials and, in this example, are shown as being the same material and are joined in the drawings to form the inverse-T gate, as explained in greater detail below.

Figure 7:
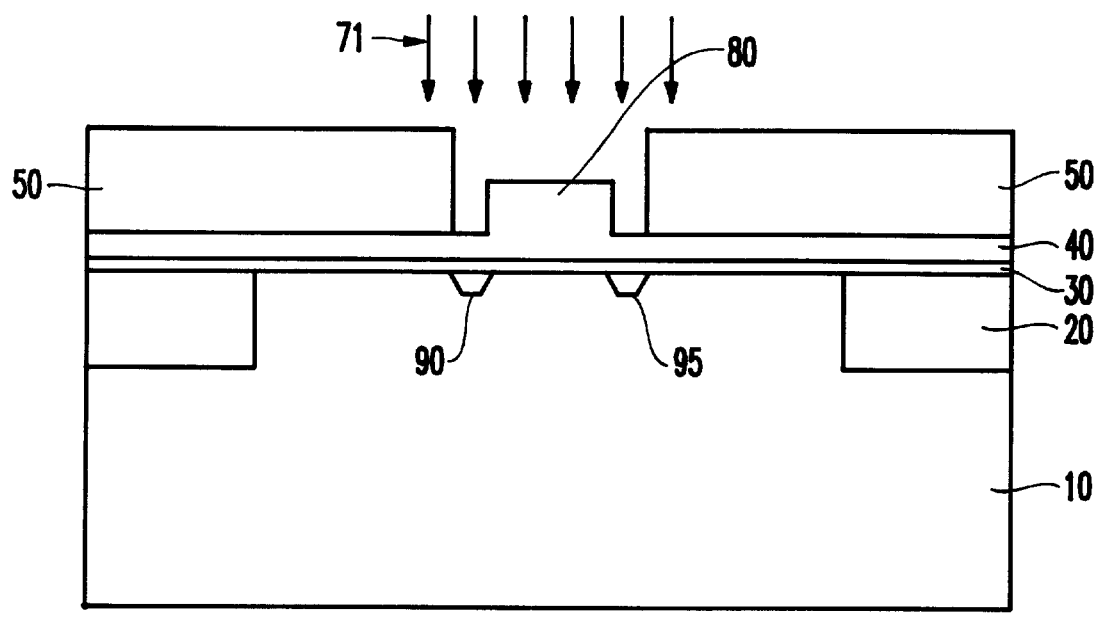
FIG. 7 is a schematic diagram of a cross-sectional view of a stage in the fabrication of a MOSFET with an inverse-T gate structure using the invention.
Figure 8:
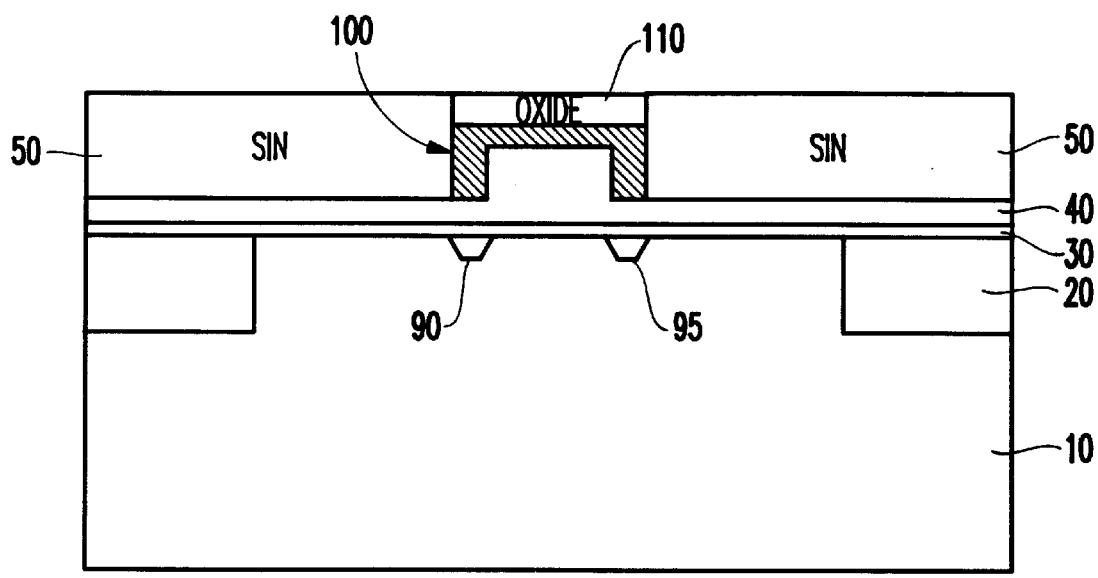
FIGS. 8a and 8b are schematic diagrams of cross-sectional views of stages in the fabrication of a MOSFET with an inverse-T gate structure using the invention.

In FIG. 7, the spacers 70, 75 are removed using a solvent/etchant that selectively attacks oxide but does not substantially affect polysilicon or silicon nitride. In FIG. 7, once the spacers 70, 75 are removed, the inverse-T shape of the gate conductor 40, 80 can be more clearly seen. At this point in the processing, the invention implants an impurity 71. The impurity will be blocked by the thicker sections of the gate 80 but can pass through the thinner portion of the gate 40 (e.g., the wings of the inverse-T gate). The impurity 71 can be a halo implant and/or LDD implant, the polarity of which will be determined by the type of transistor being manufactured. The halo implant may also include carbon for the purpose of containing a boron halo implant in an NFET device. The impurity implant process produces LDD implant regions 90, 95, and halo implant regions 97, 99 as shown in FIGS. 7–10. Implants are normal to the surface and do not require a "groundrule" limitation for adjacent topography as would angled implants to avoid shadowing. Providing normal implants does not limit scaling to smaller dimensions as would angled implants.

Next, the recess above the gate conductor 40, 80 is filled with an additional conductor 100, as shown in FIG. 8a. While the additional conductor 100 can comprise polysilicon, in a preferred embodiment, a tungsten material 100 (which can be a composite of tungsten and polysilicon, or other materials) is utilized. After the deposition, the material 100 is recessed below the level of the silicon nitride 50 and a gate cap 110 (e.g. an oxide) is formed to complete the gate structure, as shown in FIG. 8b. The additional conductor 100 has the same gate length as the underlying inverse-T gate structure 40, 80 (along the oxide). In essence, the additional conductor 100 has an inverse-U shape that matches the top of the inverse-T gate shape 40, 80.

Figure 9:
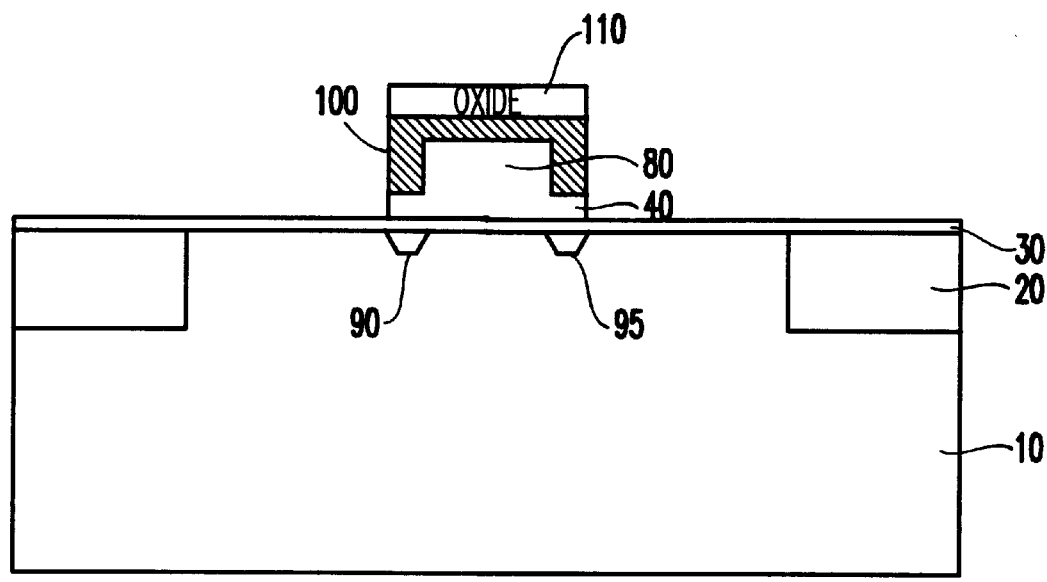
FIG. 9 is a schematic diagram of a cross-sectional view of a stage in the fabrication of a MOSFET with an inverse-T gate structure using the invention.
Figure 10:
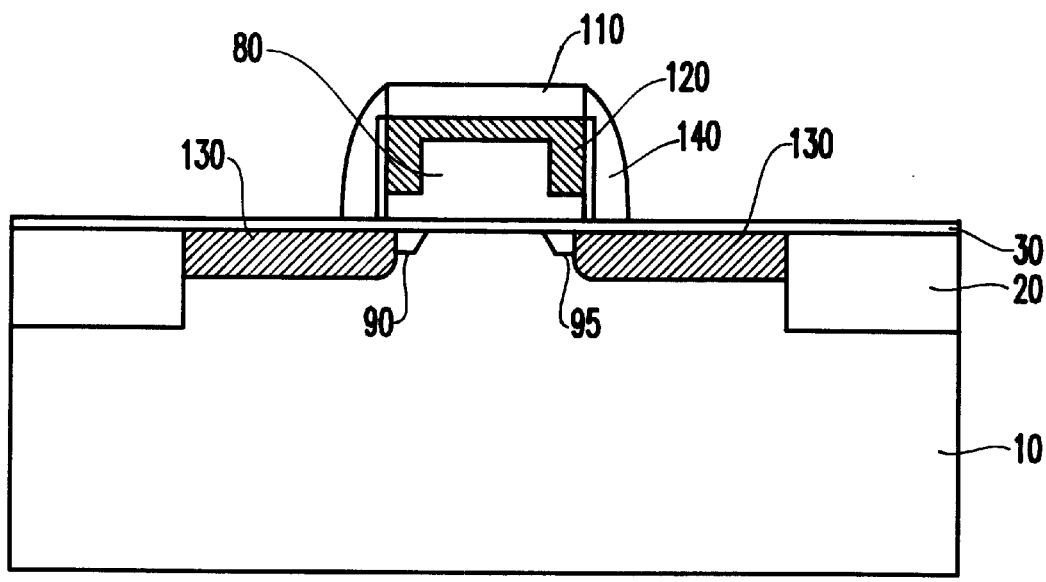
FIG. 10 is a schematic diagram of a cross-sectional view of a stage in the fabrication of a MOSFET with an inverse-T gate structure using the invention.

In FIG. 9, the silicon nitride 50 is selectively removed and the polysilicon layer 40 which exists outside the dimensions of the gate conductor is also removed (again, using a well known selective removal process). At this point, a number of alternatives are available, dependent upon the specific nature of the transistor being manufactured. For example, if the LDD implant was not made previously, it can be made now. Alternatively, the heavier source/drain implant can be performed at this time. In any manner, once the source/drain (main and LDD) implants are performed, the source/drain regions 130 are completed and shown in FIG. 10.

Conventional well-known processes are then utilize to complete the gate conductor structure. More specifically, the outer edge of the gate conductor is silicided 120. Additionally, insulating spacers 140 (which can be used to pattern the LDD implant differently from the main source/drain implant) are also formed. In addition, the gate cap 110 can be replaced with a more suitable material, if desired.

An important advance made by the invention is the ability to utilize a different material for the center 80 and wings 40 of the underlying inverse-T gate conductor. With the processing described above, the impurities within the gate conductor 40, 80 can be selectively applied at many points in the process. For example, directly after the polysilicon 40 is deposited in FIG. 1, some form of implant may be performed. Similarly, at the point in processing shown by FIG. 6, additional gate impurities may be implanted into the gate material 80. Cap 110 provides for separately doping gate 40, 80 and source drain regions 130, substantially avoiding implant for source/drain regions 130 from getting into gate conductor 40, 80. Thus, the amount of doping received by the gate conductor and even the type of impurity utilized for the gate conductor is independent of the impurities utilized for the source/drain structures 130. Also, because of hard mask layer 50, the source drain is protected during implant of gate conductor 40, 80, so source drain doping is independent of the impurities used for doping the gate.

In addition, with such processing, the wings 40 of the inverse-T gate structure can be made of a different material from the thicker portion 80 of the inverse-T gate conductor. By using different materials for the wings, the threshold voltage of the transistor can be more easily controlled. More specifically, the outer portions 40 of the gate conductor can have a work function that is different than the thicker center portion 80 of the inverse-T gate conductor, which allows for precise control of the threshold voltage of the transistor.

Further, by utilizing a different material for the tops and sides of the outer portion of the gate conductor 100 (outside the inverse-T inner portion of the gate conductor 40, 80), the outer structure of the gate conductor 100 can be used as a gate contact. Therefore, the invention produces a structure that does not require a separate gate contact because the gate itself comprises a gate contact. Further, the gate material 100 can be selected to reduced depletion of impurities from the underlying gate structure 80 during any subsequent thermal cycles. In other words, the outer gate structure material 100 can be selected to trap the desired impurities within the gate material 40, 80 and thereby maintain the preferred impurity concentration within the gate material 40, 80.

One of the principal advantages of the invention is the flexibility it provides to the engineer when designing such an inverse-T gate transistor. However, in a preferred embodiment, the inverse-T portion of the gate conductor 40, 80 would be formed of a doped polysilicon and the sides and top 100 of the gate conductor would be pure tungsten. The implant made in the processing shown in FIGS. 7–10 would comprise the LDD implant 90, 95 or halo implant 97, 99, or both. The heavier source/drain implants 130 would be made after the formation of the sidewall spacers 140. In this preferred embodiment, the halo implant 97, 99 would be precisely self-aligned with the wings 40 of the inverse-T portion of the gate conductor (in the processing shown in FIG. 7). Further, because the halo implant is not angled, its location and position can be precisely controlled with the invention. Additionally, as mentioned above, the thickness of the wings 40 is very easily controlled with the invention through the deposition of the polysilicon layer 40 in the processing shown in FIG. 1. Therefore, the invention is dramatically superior to conventional inverse-T gate manufacturing methodologies.

Figure 11:
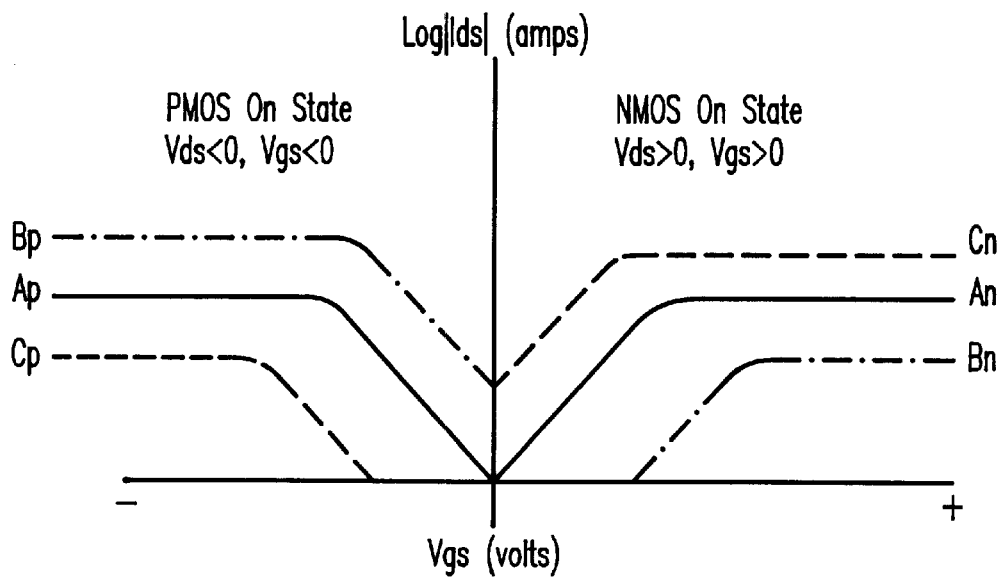
FIG. 11 is a graph showing the advantages achieved with the invention.

FIG. 11 illustrates the performance of the device formed with the inventive method. As can be seen from FIG. 11, the negative PMOS on state is substantially identical to the positive NMOS on state with respect to most important parameters measured (e.g., Bp, Ap, Cp, Cn, An, Bn). By engineering the wing 40 material differently than the silicon-T 80 one can, through doping, alter the flatband voltage of the FET device. In FIG. 11, the variables are those shown in the following chart.

| Wing Doping (40) | Thick Gate Doping (80) | Device Type | Comments |
| --- | --- | --- | --- |
| N+ | N+ | NMOS An | standard NMOS |
| P+ | P+ | NMOS Ap | standard PMOS |
| P+ | N+ | NMOS Bn | P+ wing NMOS |
| N+ | P+ | PMOS Cp | N+ wing PMOS |
| W | N+ | NMOS Cn | W wing NMOS |
| W | P+ | PMOS Cp | W wing PMOS |

Figure 12:
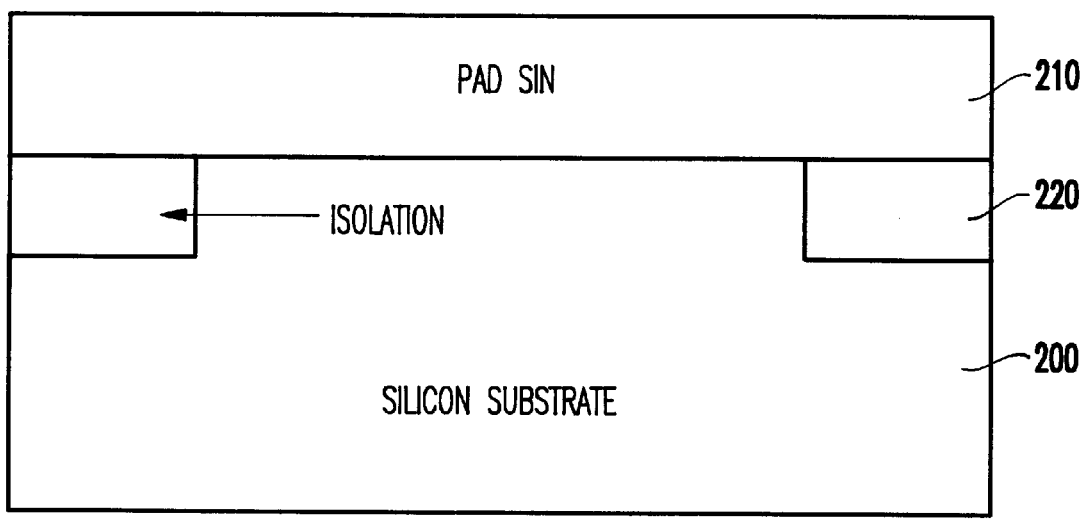
FIG. 12 is a schematic diagram of a cross-sectional view of a stage in the fabrication of a MOSFET with an inverse-T gate structure using the invention.

As mentioned above, one of the key features of the invention is that the invention does not rely upon an etching/undercutting process to define the thickness of the wings of the inverse-T gate structure. Another example of the invention is shown in FIGS. 12–20. FIG. 12 is somewhat similar to FIG. 1 in that a silicon substrate 200 is modified with the addition of isolation regions 220. A silicon nitride pad layer 210 is also formed over the structure.

Figure 13:
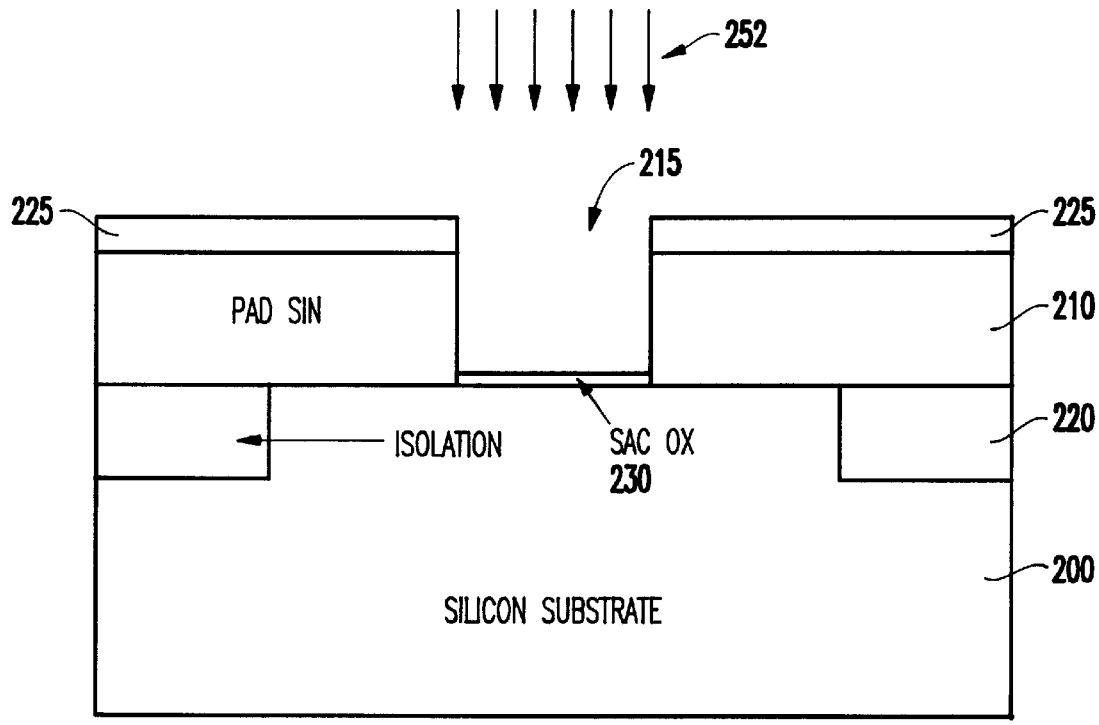
FIG. 13 is a schematic diagram of a cross-sectional view of a stage in the fabrication of a MOSFET with an inverse-T gate structure using the invention.
Figure 14:
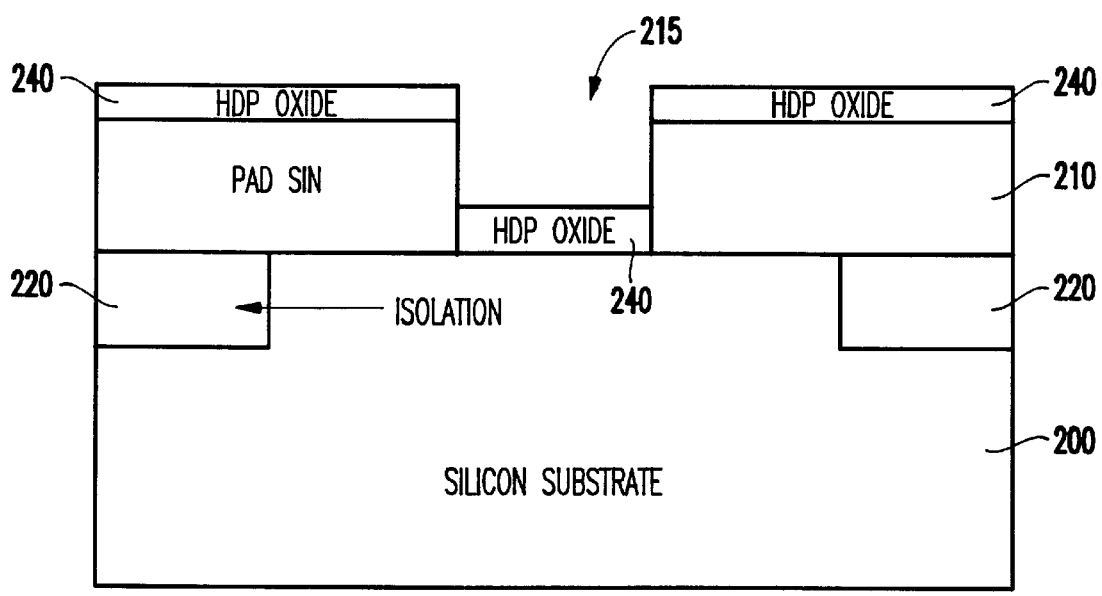
FIG. 14 is a schematic diagram of a cross-sectional view of a stage in the fabrication of a MOSFET with an inverse-T gate structure using the invention.
Figure 15:
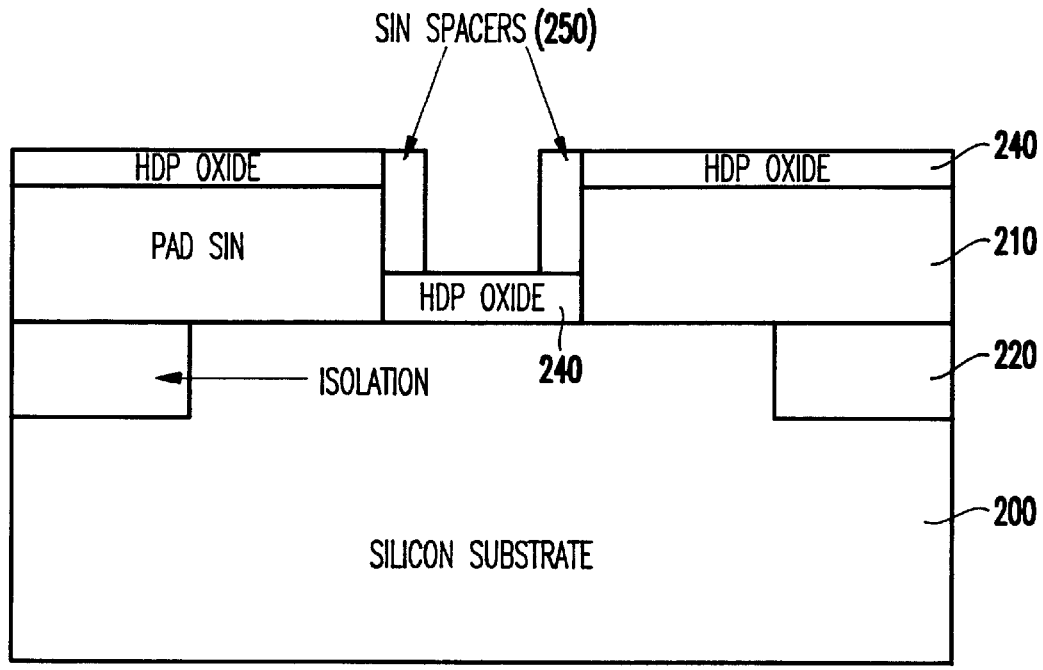
FIG. 15 is a schematic diagram of a cross-sectional view of a stage in the fabrication of a MOSFET with an inverse-T gate structure using the invention.

In FIG. 13, the pad silicon nitride 210 is patterned to form an opening 215 using a photoresist layer 225 in a similar process to that described above. The well implant 252 is performed, the sacrificial oxide 230 is formed and the mask 225 is removed. In FIG. 14, the sacrificial oxide 230 is removed and an oxide 240 is formed over the structure. The oxide 240 is preferably formed using a high density plasma (HDP) process. Sidewall spacers 250 are then formed using the sidewall spacer technology discussed above, as shown in FIG. 15. In a preferred embodiment the sidewall spacers comprise silicon nitride. After the sidewall spacers 250 are formed, the oxide 240 is removed, as shown in FIG. 16.

Figure 16:
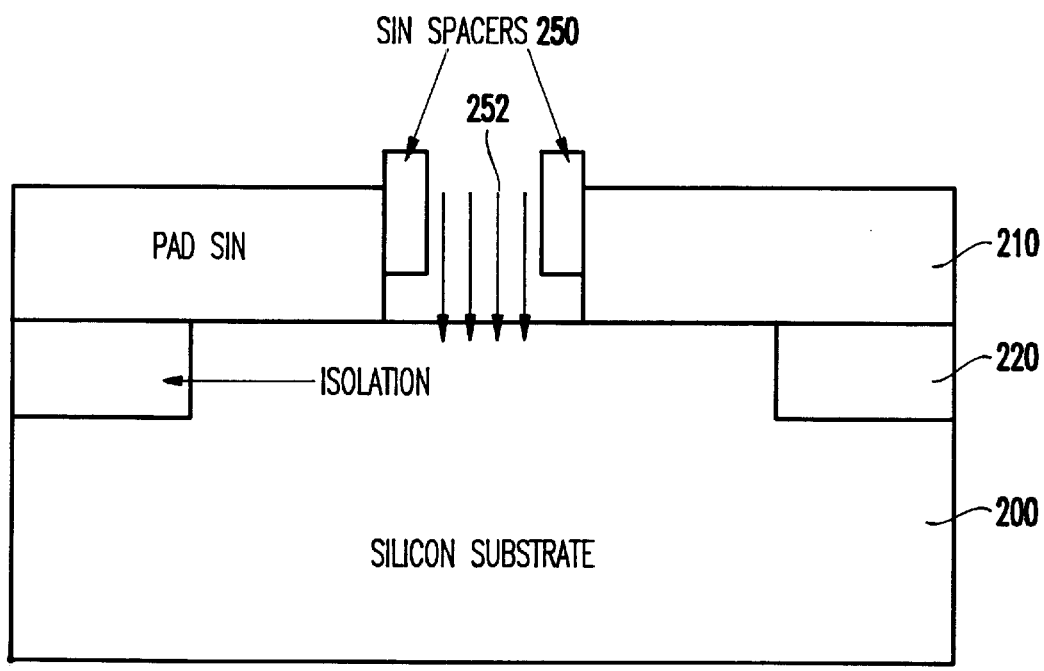
FIG. 16 is a schematic diagram of a cross-sectional view of a stage in the fabrication of a MOSFET with an inverse-T gate structure using the invention.

The flexibility of the invention is shown again in FIGS. 13 and 16. The well or channel implant 252 can be made at either processing step without substantially affecting the invention. This flexibility provides the design engineer with many choices which increases the invention's applicability to create new and different structures. The well or channel implants created are shown as item 255a and 25b in FIG. 17.

Figure 17:
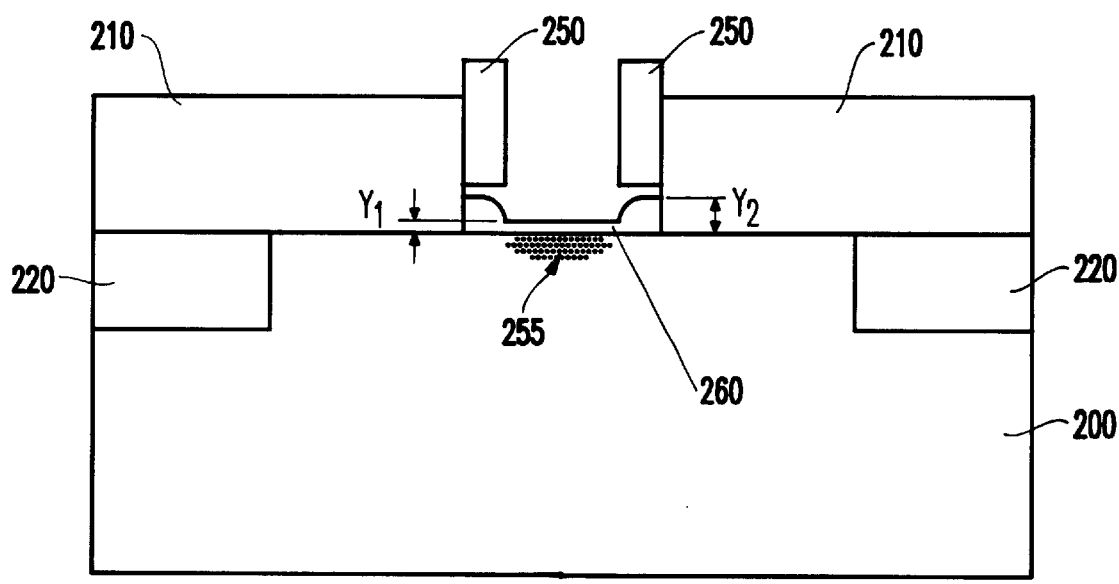
FIG. 17 is a schematic diagram of a cross-sectional view of a stage in the fabrication of a MOSFET with an inverse-T gate structure using the invention.

Also, FIG. 17 illustrates the gate oxide 260 which is grown over the silicon substrate 200. The gate oxide 260 can be simply thermally grown from the silicon 200. Alternatively, in a preferred embodiment, nitrogen can be introduced prior to the oxidation process. The introduction of nitrogen causes the center portion of the gate oxide 260 to be thinner than the portions protected by the spacers 250. This allows the resulting gate oxide 260 to have a greater thickness in the outer regions than the center region. The thickness of the center region is shown as the variable y1 and the thickness of the outer regions is shown as variable y2. In a preferred embodiment, the ratio of y2/y1 is preferably in the range of 1.2–1.5.

Figure 18:
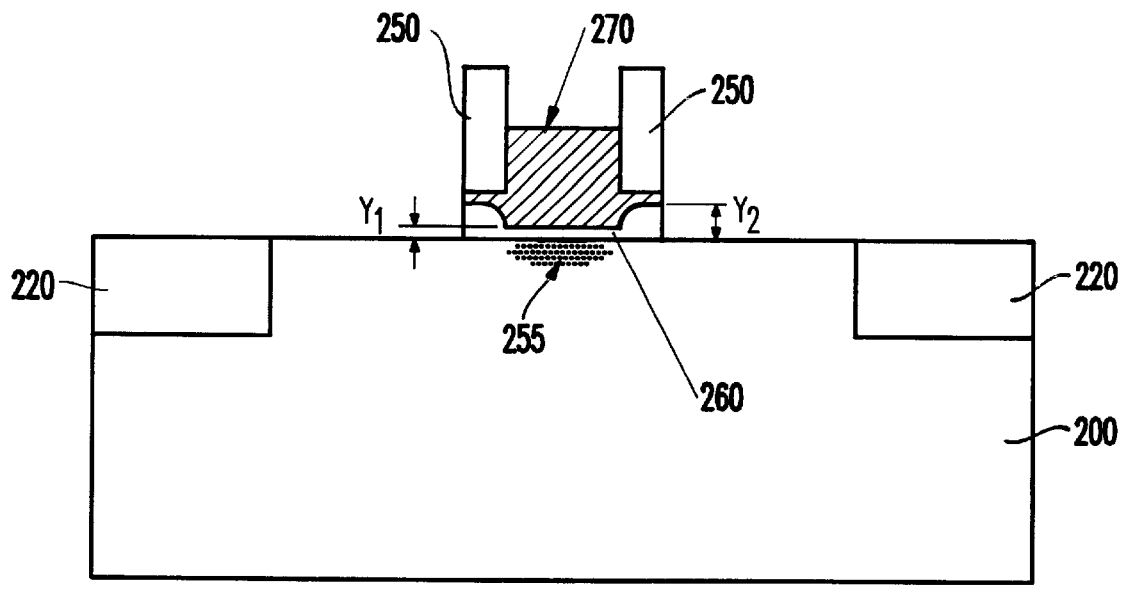
FIG. 18 is a schematic diagram of a cross-sectional view of a stage in the fabrication of a MOSFET with an inverse-T gate structure using the invention.

After the gate oxide 260 is formed, the gate conductor material 270 (polysilicon) is deposited over the structure and selectively etched below the level of the silicon nitride pad 210. The silicon nitride pad 210 is then subsequently removed, as shown in FIG. 18. Then, the spacers 250 are removed, revealing the inverse-T gate structure shown in FIG. 19. The outer surface of the inverse-T gate structure is silicided 275, using well known silicide processing. In addition, the conventional halo/LDD implants 291 are performed, as discussed above, to form the source/drain regions 290 and optional halo regions.

Once again, the invention controls the thicknesses of the wings of the inverse-T gate structure without relying upon the inherently inaccurate etching/undercutting processes that are performed conventionally. To the contrary, the invention controls the thickness of the wing portions of the inverse-T gate conductor by controlling the thickness of the oxide 240 that is deposited in the processing step shown in FIG. 15. More specifically, the height of the spacers 250 is controlled by the thickness of the oxide layer 240. As discussed above, the deposition process used to form the oxide layer 240 is substantially more accurate and easier to control than is the conventional etching/undercutting process. Further, the thickness of the wing regions can be further controlled by the processing shown in FIG. 17 where the thickness of the gate oxide 260 is selectively varied by the introduction of nitrogen.

Figure 19:
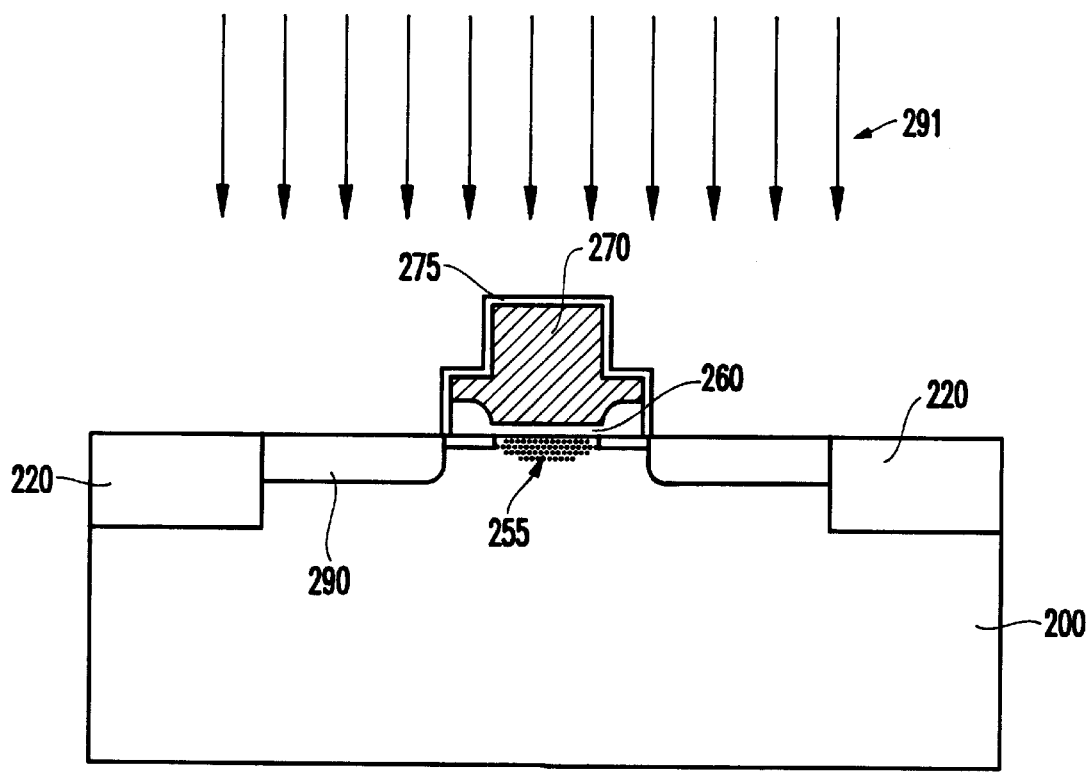
FIG. 19 is a schematic diagram of a cross-sectional view of a stage in the fabrication of a MOSFET with an inverse-T gate structure using the invention.
Figure 20:
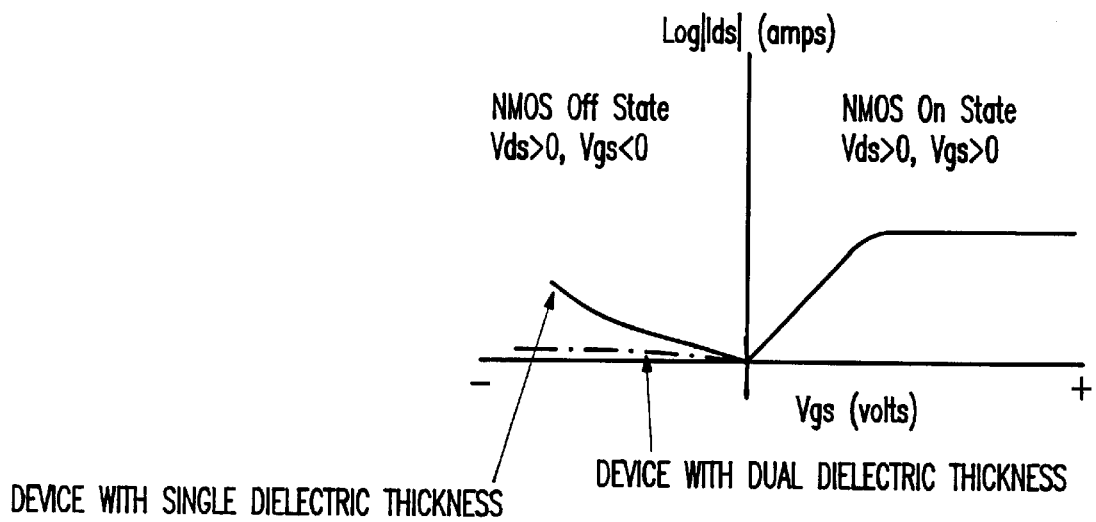
FIG. 20 is a graph showing the advantages achieved with the invention.

Further, by producing a gate oxide 260 that is thinner along the center portion and thicker under the wings, the invention is able to produce a more controlled off state of the NMOS device. For example, as shown in FIG. 20, with just a single dielectric thickness, the amperage (current) increases as the negative voltage increases in the NMOS off state. To the contrary, when a dual dielectric thickness 260 is utilized, the off state remains at substantially reduced leakage even as negative voltage increases. Therefore, the inventive structure 260 shown in FIG. 19 provides superior off-current control when compared to conventional structures that have a gate dielectric with a single thickness. As would be known by one ordinarily skilled in the art given this disclosure, the dual thickness gate oxide 260 can be utilized with conventional gate conductors (e.g., non-inverse-T gate conductors). In other words, the above processing can be easily modified by skipping the processing which forms the spacers 250 in order to form a conventional rectangular gate conductor in place of the inverse-T gate conductor 270.

As mentioned above, the amount of doping which passes through the wings of the inverse-T gate structure and reaches the underlying substrate is highly dependent upon the thickness of the wings and the angle of the implant. When the manufacturing process does not consistently produce wings having a uniform thickness and the implant angle is not blocked by to the semiconductor surface, the doping of the substrate regions below the wings becomes inconsistent. This leads to non-uniform device performance and increases the defect rate.

As inverse-T gate conductors become smaller and smaller with advancing technology, these variations in the etching/undercutting processes produce inconsistencies beyond acceptable manufacturing tolerances. The invention provides a new system/method of manufacturing inverse-T gate structures that does not rely upon an etching/undercutting process nor does it recap on angled implants under the wings. Further, the invention consistently manufactures inverse-T gate structures with the same size dimensions to ensure uniform doping of the LDD and halo regions.

More specifically, the invention utilizes damascene processing to form the inverse-T gate structures. Such processing avoids problems encountered by conventional methods in large part because the etching of the gate/mask is avoided.

While the invention has been described in terms of preferred embodiments, those skilled in the art will recognize that the invention can be practiced with modification within the spirit and scope of the appended claims.

What is claimed is:

1. A semiconductor structure comprising:

a substrate and a gate on said substrate, said substrate comprising an implanted region, wherein said gate comprises a first conductive portion comprising a first thickness in a first location and a second thickness in a second location, wherein said second thickness is less than said first thickness, and wherein said second thickness is located to allow doping to penetrate to create said implanted region, wherein said gate further comprises a second conductive portion disposed on said first conductive portion, said second conductive portion having a planar upper surface over said first location and said second location, and wherein said gate comprises a gate conductor and a gate dielectric and wherein said first conductive portion of said gate comprises a first material adjacent said gate dielectric and a second material adjacent said gate dielectric, said second trial being different from said first material.

2. The structure as recited in claim 1, wherein said first material is along said first location and said second material is along said second location.

3. A semiconductor device, comprising:

a substrate:

a gate dielectric on said substrate; and a gate conductor on said gate dielectric, said gate conductor comprising a first portion contacting said gate dielectric and a second portion contacting said gate dielectric, said first portion being of a material different than said second portion, wherein said first portion is thicker than said second portion, and a third portion overlying said first and second portions and having a planar upper surface.

4. The semiconductor device in claim 3, wherein said first portion comprises tungsten.

5. The semiconductor device in claim 3, wherein said first portion is a center portion of said gate conductor and said second portion is an edge portion of said gate conductor.

6. The semiconductor device in claim 3, wherein the device further comprises a source/drain diffusion and said gate conductor comprises a gate of an FET.

7. The structure in claim 4, wherein said second portion comprises polysilicon.

8. A gate for use in an integrated circuit transistor, said gate comprising:

a center section; and gate edges adjacent said center section, wherein said center section is thicker than said gate edges, wherein said center section and said gate edges comprise different materials wherein said center section and said gate edges form of an inverse-T shaped structure, further comprising a second portion covering said inverse-T shaped structure, wherein said second portion has a planar upper surface.

9. The gate in claim 8, wherein said second portion covers said center section and said gate edges.

10. The gate in claim 8, wherein said second portion has an inverse-U shape that matches the top of said inverse-T shaped structure.

11. An integrated circuit transistor comprising:

a substrate;

a gate oxide over said substrate; and a gate over said gate oxide, wherein said gate comprises;

a center section; and gate edges adjacent said center section, wherein said center section is thicker than said gate edges, wherein said center section and said gate edges comprise different materials wherein said center section and said gate edges form of an inverse-T shaped structure, further comprising a second portion covering said inverse-T shaped structure, wherein said second portion has a planar upper surface.

12. The integrated circuit transistor in claim 11, wherein said second portion covers said center section and said gate edges.

13. The integrated circuit transistor in claim 11, wherein said second portion has an inverse-U shape that matches the top of said inverse-T shaped structure.

\* \* \* \* \*